United States Patent
Finlay et al.

(10) Patent No.: US 10,256,126 B2
(45) Date of Patent: Apr. 9, 2019

(54) GAS FLOW PROCESS CONTROL SYSTEM AND METHOD USING CRYSTAL MICROBALANCE(S)

(71) Applicant: GLOBALFOUNDRIES INC., Grand Cayman (KY)

(72) Inventors: Robert B. Finlay, Ballston Lake, NY (US); Brian Conerney, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 25 days.

(21) Appl. No.: 15/272,924

(22) Filed: Sep. 22, 2016

(65) Prior Publication Data

US 2018/0082871 A1 Mar. 22, 2018

(51) Int. Cl.
*G01F 1/66* (2006.01)
*C23C 16/52* (2006.01)
(Continued)

(52) U.S. Cl.
CPC .. *H01L 21/67253* (2013.01); *C23C 16/45544* (2013.01); *C23C 16/52* (2013.01);
(Continued)

(58) Field of Classification Search
None
See application file for complete search history.

(56) References Cited

U.S. PATENT DOCUMENTS

| 8,951,615 | B2 | 2/2015 | Elam et al. |
| 2003/0193539 | A1* | 10/2003 | Umetani ............... B41J 2/0456 347/19 |

(Continued)

FOREIGN PATENT DOCUMENTS

| CN | 104380101 A | 2/2015 |
| TW | I427791 B | 2/2014 |

OTHER PUBLICATIONS

Johann W. Bartha et al., "Fundamental insight into ALD processing by insitu observation", Technische Universitat Dresden, Grenoble, Aug, 10, 2013, pp. 1-35.
(Continued)

*Primary Examiner* — Charles D Garber
*Assistant Examiner* — Xiaoming Liu
(74) *Attorney, Agent, or Firm* — Gibb & Riley, LLC; Francois Pagette

(57) ABSTRACT

Disclosed are process control systems and methods incorporating a crystal microbalance (CM) (e.g., a quartz crystal microbalance (QCM)) into gas flow line(s) entering and/or exiting a processing chamber. A CM measures the resonance of a quartz crystal sensor contained therein as gas flows over that crystal sensor and can, thereby be used to accurately monitor, in real time, the mass flow rate of the gas. The mass flow rate may indicate that gas contamination has occurred and, in response, a controller can cause the gas flow to stop. Additionally, the mass flow rate may indicate the desired result will not be achieved within the processing chamber and, in response, advanced process control (APC) can be performed (e.g., the controller can adjust the gas flow). CM(s) incorporated into gas flow lines entering and/or exiting a processing chamber can provide precise measurements for process monitoring at minimal cost.

20 Claims, 7 Drawing Sheets

(51) Int. Cl.
  *H01L 21/02* (2006.01)
  *H01L 21/67* (2006.01)
  *C23C 16/455* (2006.01)
  *H01L 21/311* (2006.01)
  *H01J 37/305* (2006.01)
  *G01F 1/78* (2006.01)

(52) U.S. Cl.
  CPC ...... *H01J 37/3056* (2013.01); *H01L 21/0228* (2013.01); *H01L 21/31116* (2013.01); *G01F 1/66* (2013.01); *G01F 1/662* (2013.01); *G01F 1/78* (2013.01)

(56) References Cited

U.S. PATENT DOCUMENTS

| | | | | |
|---|---|---|---|---|
| 2008/0236481 | A1* | 10/2008 | Petersen | C23C 14/12 118/50.1 |
| 2011/0163452 | A1* | 7/2011 | Horii | C23C 16/06 257/758 |
| 2012/0213946 | A1 | 8/2012 | Elam et al. | |
| 2014/0053779 | A1 | 2/2014 | Martinson et al. | |
| 2015/0168956 | A1* | 6/2015 | Guan | G01N 30/32 137/2 |
| 2015/0286222 | A1* | 10/2015 | Goldstein | G05D 7/0635 700/282 |
| 2015/0323441 | A1* | 11/2015 | Lachance | G01N 11/16 73/54.24 |

OTHER PUBLICATIONS

Argonne National Laboratory, "Wall-Mounted QCM Fixture for Atomic Layer Deposition", Aug. 2013, pp. 1-2.
Taiwanese Application No. 105132370, Examination Report dated Apr. 10, 2018 (including Search Report dated Apr. 3, 2018), pp. 1-20.
Taiwanese Application No. 105132370, Notice of Allowance dated Oct. 3, 2018, pp. 1-3.

* cited by examiner

Crystal Microbalance (e.g., 113 of FIG. 1; 213, 223, and/or 233 of FIG. 2)

Back Side

Front Side

GAS FLOW PROCESS CONTROL SYSTEM AND METHOD USING CRYSTAL MICROBALANCE(S)

FIELD OF THE INVENTION

The present invention relates to process control systems and methods and, particularly, gas flow process control systems and methods.

BACKGROUND

In integrated circuit (IC) manufacturing and other industries, processes that require the use of one or more gases within a processing chamber are typically very sensitive to variations in the properties of the gas(es) including the composition and/or the concentration. For example, atomic layer deposition (ALD) and atomic layer etching (ALE) processes use processing chambers to deposit an atomic layer of material onto a semiconductor wafer and etch an atomic layer of material off of a semiconductor wafer, respectively. During processing (i.e., during ALD or ALE), a first gas and a second gas (also referred to as precursors) are pulsed in sequence into a processing chamber and purged from the processing chamber between each of the pulses. By repeatedly exposing the surface of a semiconductor wafer within the processing chamber to the two gases during separate pulses followed by purges, discrete self-limiting reactions are allowed to occur, thereby resulting in the deposition (or, if applicable, the etching) of an atomic layer of material. Variations in the composition and/or concentration of these gases can lead to wafer-to-wafer variations, which can in turn lead to faults. To avoid such wafer-to-wafer variations, advanced process control (APC) (e.g., proportional-integral-derivative (PID) feedback control) techniques can be performed. However, current APC techniques may not be sufficiently precise and/or may not be cost-efficient.

SUMMARY

In view of the foregoing, disclosed herein are process control systems and methods that incorporate a crystal microbalance (CM) (e.g., a quartz crystal microbalance (QCM)) into one or more gas flow lines entering and/or exiting a processing chamber. For example, in the case of an atomic layer deposition (ALD) chamber or an atomic layer etching (ALE) chamber, a CM can be incorporated into each of the gas flow lines entering the chamber as well as into the gas flow line exiting the chamber. Such a CM can measure the resonance of a crystal sensor (e.g., a quartz crystal sensor) contained therein as gas flows over that crystal sensor and can, thereby be used to accurately monitor, in real time, the mass flow rate of the gas. The actual mass flow rate may indicate that the desired result will not be achieved within the processing chamber and, in response, advanced process control (APC) can be performed (e.g., the controller can adjust the gas flow in order to achieve the desired result). Additionally, the mass flow rate can indicate that gas contamination or other system failure has occurred and, in response, a controller can cause the gas flow to stop. Such CM(s) incorporated into gas flow lines entering and/or exiting a processing chamber can provide precise measurements for process monitoring at minimal cost.

More particularly, disclosed herein are embodiments of a process control system. The system can include a processing chamber for performing a process. The processing chamber can have at least one inlet. The system can further include a gas source; a tube (i.e., a gas flow line) connecting the gas source to the inlet of the processing chamber; and a crystal microbalance (CM) (e.g., a quartz crystal microbalance (QCM)) integrated into the tube prior to the inlet. Gas from the gas source can flow through the tube to the inlet of the processing chamber via the CM and the CM can determine an actual mass flow rate of the gas flowing therethrough (i.e., prior to the gas entering the processing chamber). The system can further include a valve that controls the flow of the gas from the gas source into the tube and a controller, which is in communication with the CM, which is operably connected to the valve, and which can adjust the valve based on the actual mass flow rate.

One exemplary system can be for atomic layer deposition (ALD) or atomic layer etching (ALE). This system can include a processing chamber for processing a semiconductor wafer and, specifically, either an ALD chamber for depositing an atomic layer of material on the semiconductor wafer or an ALE chamber etching an atomic layer of material from the wafer. In either case, the processing chamber can have at least a first inlet, a second inlet and an outlet.

This system can further include a first gas source for a first gas; a first tube (i.e., a first gas flow line) connecting the first gas source to the first inlet; and a first CM integrated into the first tube. A first valve can control the flow of the first gas from the first gas source into the first tube. Specifically, during a first pulse, the first gas from the first gas source can flow through the first valve and the first tube into the first inlet of the processing chamber via the first CM and the first CM can determine a first actual mass flow rate of the first gas flowing therethrough (i.e., prior to the first gas entering the processing chamber).

This system can further include a second gas source for a second gas; a second tube (i.e., a second gas flow line) connecting the second gas source to the second inlet; and a second CM integrated into the second tube. A second valve can control the flow of the second gas from the second gas source into the second tube. Specifically, during a second pulse following the first pulse, the second gas can flow from the second gas source through the second valve and the second tube into the second inlet of the processing chamber via the second CM and the second CM can measure a second actual mass flow rate of the second gas flowing therethrough (i.e., prior to the second gas entering the processing chamber).

This system can further include a purge valve at the outlet of the processing chamber and a third tube (i.e., a third gas flow line) extending from the outlet to, for example, a vent or gas collection system. After each pulse described above, all gases can be purged out the outlet of the processing chamber through the purge value and into the third tube.

This system can further include a controller, which is in communication with the first CM and the second CM, which is operably connected to the first valve and the second valve and which can adjust the first valve based on the first actual mass flow rate and the second valve based on the second actual mass flow rate. Optionally, this system can further include a third CM integrated into the third tube. If present, the third CM can determine a third actual mass flow rate of the purged gas. In this case, the controller can be in communication with the third CM and can also adjust the first valve and/or the second valve based on the third actual mass flow rate.

Also disclosed are embodiments of a process control method. The method can include performing a process using a processing chamber, wherein the performance of the process includes causing a gas to flow into an inlet of the processing chamber through a tube (i.e., a gas flow line). The method can further include using a crystal microbalance (CM) (e.g., a quartz crystal microbalance (QCM)) integrated into the tube to determine an actual mass flow rate of the gas prior to the gas entering the processing chamber. The method can further include adjusting, by a controller based on the actual mass flow rate, a valve that controls the flow of the gas from the gas source into the tube.

One exemplary method can be for atomic layer deposition (ALD) or atomic layer etching (ALE). This method can include performing a process (e.g., an ALD process, wherein an atomic layer of material is deposited on a semiconductor wafer, or an ALE process, wherein an atomic layer of material is etched away from a semiconductor wafer) using a processing chamber (e.g., an ALD chamber or an ALE chamber). Specifically, this process (i.e., the ALD or ALE process) can be performed using a processing chamber. The performance of the process can include, during a first pulse, causing a first gas to flow from a first gas source through a first valve and a first tube (i.e., a first gas flow line) into a first inlet of the processing chamber and determining a first actual mass flow rate of the first gas prior to that first gas entering the processing chamber using a first CM, which is integrated into the first tube. The performance of the process can further include, during a second pulse that follows the first pulse, causing a second gas to flow from a second gas source through a second valve and a second tube (i.e., a second gas flow line) into a second inlet of the processing chamber and determining a second actual mass flow rate of the second gas prior to that second gas entering the processing chamber using a second CM, which is integrated into the second tube. The performance of the process can further include, after each pulse described above, purging all gas out an outlet of the processing chamber through a purge value and into a third tube (i.e., a third gas flow line).

This method can further include adjusting, by a controller, the first valve based on the first actual mass flow rate and/or the second valve based on the second actual mass flow rate, wherein the first valve controls the flow of the first gas from the first gas source into the first tube and the second valve controls the flow of the second gas from the second gas source into the second tube.

Optionally, the method can also include determining a third actual mass flow rate of the purged gas as it exist the processing chamber using a third CM, which is integrated into the third tube. In this case, adjustment of the first valve and/or the second valve by the controller can also be based on the third actual mass flow rate.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
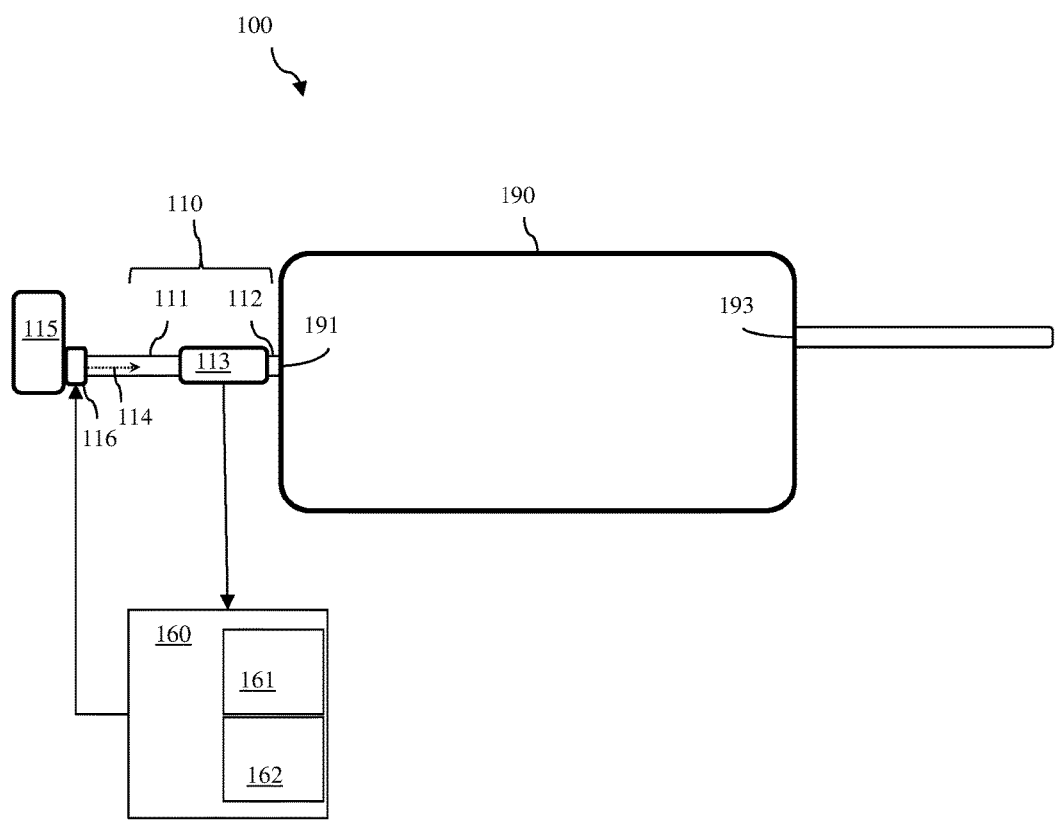
FIG. 1 is a schematic diagram illustrating an embodiment of a process control system that incorporates a crystal microbalance into a gas flow line entering a processing chamber.

As mentioned above, in integrated circuit (IC) manufacturing and other industries, processes that require the use of one or more gases within a processing chamber are typically very sensitive to variations in the properties of the gas(es) including the composition and/or the concentration. For example, atomic layer deposition (ALD) and atomic layer etching (ALE) processes use processing chambers to deposit an atomic layer of material onto a semiconductor wafer and etch an atomic layer of material off of a semiconductor wafer, respectively. During processing (i.e., during ALD or ALE), a first gas and a second gas (also referred to as precursors) are pulsed in sequence into a processing chamber and purged from the processing chamber between each of the pulses. By repeatedly exposing the surface of a semiconductor wafer within the processing chamber to the two gases during separate pulses followed by purges, discrete self-limiting reactions are allowed to occur, thereby resulting in the deposition (or, if applicable, the etching) of an atomic layer of material. Those skilled in the art will recognize that an "atomic layer" refers to a very thin film, wherein the thickness of the film is defined at the atomic level. During ALD, variations in the concentration and/or composition of the material(s) in the first gas or the second gas within the processing chamber can result in wafer-to-wafer variations in the thickness and/or the composition of the deposited layer. During ALE, variations in the composition and/or concentration of the material(s) in the first gas or the second gas within the processing chamber can result in wafer-to-wafer variations in the etch depth. To avoid such wafer-to-wafer variations, which may lead to faults, advanced process control (APC) (e.g., proportional-integral-derivative (PID) feedback control) techniques can be performed. For example, during ALD and ALE, measurements of the volumetric flow rate of the gases input into the processing chamber can be acquired (e.g., using volumetric flow rate sensors) and/or measurements of the composition of the gases purged from the processing chamber can be acquired (e.g., using a residual gas analyzer (RGA)). Based on such measurements, adjustments can be made to the processing specifications (e.g., to valve settings) used during subsequent processing in order to achieve the desired result. However, such volumetric flow rate sensors may be too imprecise and RGAs may be too costly. Recently, APC techniques that use quartz crystal microbalance (QCM) fixtures have been developed for use within an ALD chamber. Specifically, QCM fixtures can be placed within the ALD chamber and, during ALD, material can be deposited onto the fixtures. Measurements taken from the QCM fixtures can indicate the thickness and/or composition of the deposited layer. However, this technique can result in unwanted waste (e.g., if the deposited layer is too thick or does not contain the desired material composition, thereby leading to scrapping of the wafer).

In view of the foregoing, disclosed herein are process control systems and methods that incorporate a crystal microbalance (CM) (e.g., a quartz crystal microbalance (QCM)) into one or more gas flow lines entering and/or exiting a processing chamber. For example, in the case of an atomic layer deposition (ALD) chamber or an atomic layer etching (ALE) chamber, a CM can be incorporated into each of the gas flow lines entering the chamber as well as into the gas flow line exiting the chamber. Such a CM can measure the resonance of a crystal sensor (e.g., a quartz crystal sensor) contained therein as gas flows over that crystal sensor and can, thereby be used to accurately monitor, in real time, the mass flow rate of the gas. The actual mass flow rate may indicate that the desired result will not be achieved within the processing chamber and, in response, advanced process control (APC) can be performed (e.g., the controller can adjust the gas flow in order to achieve the desired result). Additionally, the mass flow rate can indicate that gas contamination or other system failure has occurred and, in response, a controller can cause the gas flow to stop. Such CM(s) incorporated into gas flow lines entering and/or exiting a processing chamber can provide precise measurements for process monitoring at minimal cost.

More particularly, referring to FIG. 1, disclosed herein are embodiments of a process control system 100. The system 100 can include a processing chamber 190. This processing chamber 190 can be any processing chamber that uses gas for performing a process. Such processing chambers can include, but are not limited to, chemical vapor deposition chambers for depositing material onto a work piece (e.g., a semiconductor wafer or other work piece), chemical vapor etching chambers for etching material off of a work piece (e.g., a semiconductor wafer or other work piece), chambers for cleaning a surface of a work piece (e.g., a semiconductor wafer or other work piece), etc. The processing chamber 190 can have at least one inlet 191 for receiving a gas 114 (i.e., an opening that allows gas to pass into the chamber) and at least one outlet 193 for releasing the gas (i.e., an opening that allows gas to exit from the chamber).

The system 100 can further include a gas source 115 for providing the gas 114 and a tube 110 (i.e., a gas flow line) connecting the gas source 115 to the inlet 191 of the processing chamber 190. The system 100 can further include a valve 116 that controls the flow of the gas 114 from the gas source 115 into the tube 110 and a crystal microbalance (CM) 113 (e.g., a quartz crystal microbalance (QCM) or other suitable crystal-type microbalance) that is integrated into the tube 110 prior to the inlet 191 of the processing chamber 190. For example, the tube 110 can have a first portion 111 that connects that gas source 115 to the CM 113 and a second portion 112 that connects the CM 113 to the inlet 191. Gas 114 from the gas source 115 can flow through the valve 116 and the tube 110 into the inlet of the processing chamber via the CM 113. For example, gas 114 from the gas source 115 can be released by the valve 116 into the first portion 111 of the tube 110, pass through the CM 113 into the second portion 112 of the tube 110 and then pass through the inlet 191 into the processing chamber 190. For purposes of this disclosure, a CM refers to an instrument configured with a crystal sensor (e.g., a quartz crystal sensor) for measuring mass variation. In this case, the CM 113 can determine (i.e., can be adapted to determine, can be configured to determine, etc.) an actual mass flow rate of the gas 114 flowing through the tube 110 (i.e., prior to the gas 114 entering the processing chamber 190). For purposes of this disclosure, "mass flow rate" refers to the mass of the gas that flows through a given point per unit time and at a known pressure and a known temperature. The "actual mass flow rate" refers to the current mass flow rate as determined by the CM for a gas as that gas flows through the CM at a given period in time (e.g., during a given pulse period within which the gas is permitted to flow from the gas source to the inlet of the processing chamber during the performance of a process). Those skilled in the art will recognize that the mass flow rate is distinguishable from the volumetric flow rate, which refers to the volume of gas that flows through a given point per unit time. An exemplary CM that can be incorporated into the system 100 of FIG. 1 is described in greater detail below and illustrated in FIG. 3.

The actual mass flow rate determined by the CM 113 may indicate that the composition and concentration of material(s) (i.e., element(s) or compound(s)) in the gas 114 will be on target within the processing chamber 190 for the process at issue and, thus, that the desired results will be achieved in the processing chamber 190. Alternatively, the actual mass flow rate may indicate that composition and/or concentration of material(s) (i.e., element(s) or compound(s)) in the gas 114 will be off target within the processing chamber 190 for the process at issue and, thereby that the desired result will not be achieved within the processing chamber 190 and, possibly, that a system failure (e.g., a gas contamination or a gas leak) has occurred. A finding that the composition and/or concentration of material(s) in the gas 114 will be off target within the processing chamber 190 can trigger corrective action within the system 100.

Specifically, the system 100 can further include a controller 160, which is in communication with the CM 113, which is operably connected to the valve 116, and which can adjust the valve 116 based on the actual mass flow rate, as determined by the CM 113. To accomplish this the controller 160 can include a memory 161 that stores a previously determined target mass flow rate for the gas 114 for the process at issue.

For purposes of this disclosure, a "target mass flow rate" refers to an optimal mass flow rate for achieving a desired composition and concentration of a gas within a processing chamber and, thereby the desired results from the process. Such a target mass flow rate can, for example, be determined empirically for a specific process step of a specific process using a specific process chamber.

The controller 160 can further include a processor 162 that can access the memory 161 and that can compare the actual mass flow rate of the gas 114, as determined by the CM 113, to the target mass flow rate. If the actual mass flow rate of the gas 114 is equal to the target mass flow rate, then the controller 160 can maintain the settings for the valve 116. However, if the actual mass flow rate of the gas 114 is different from the target mass flow rate, the controller 160 can adjust the settings on the valve 116, as necessary, in order to meet the target mass flow rate and, thereby to achieve the desired result in the processing chamber. Adjusting of the valve settings can include, for example, adjusting the pulse period during which gas 114 is released through the valve 116 and/or the aperture size of the valve 116, if the aperture is variable. Specifically, when the actual mass flow rate of the gas 114 is below the target mass flow rate, the pulse period for opening the valve 116 and/or the size of the aperture of the valve 116 can be increased; whereas when the actual mass flow rate of the gas 114 is above the target mass flow rate, the pulse period for opening the valve 116 and/or the size of the aperture of the valve 116 can be decreased.

Furthermore, if the actual mass flow rate of the gas 114 is different from the target mass flow rate, the controller 160 can also determine the difference between the actual mass flow rate and the target mass flow rate and can compare that difference to a threshold difference stored in the memory 161. When the determined difference exceeds the threshold difference, a system failure may be indicated. This system failure may be a gas contamination (e.g., when the actual mass flow rate is higher than the target mass flow rate by at least threshold difference) or a gas leak (e.g., when the actual mass flow rate is lower than the target mass flow rate by at least the threshold difference). When such a system failure is indicated, the controller 160 can cause the valve 116 to close, thereby stopping all processing.

Figure 2:
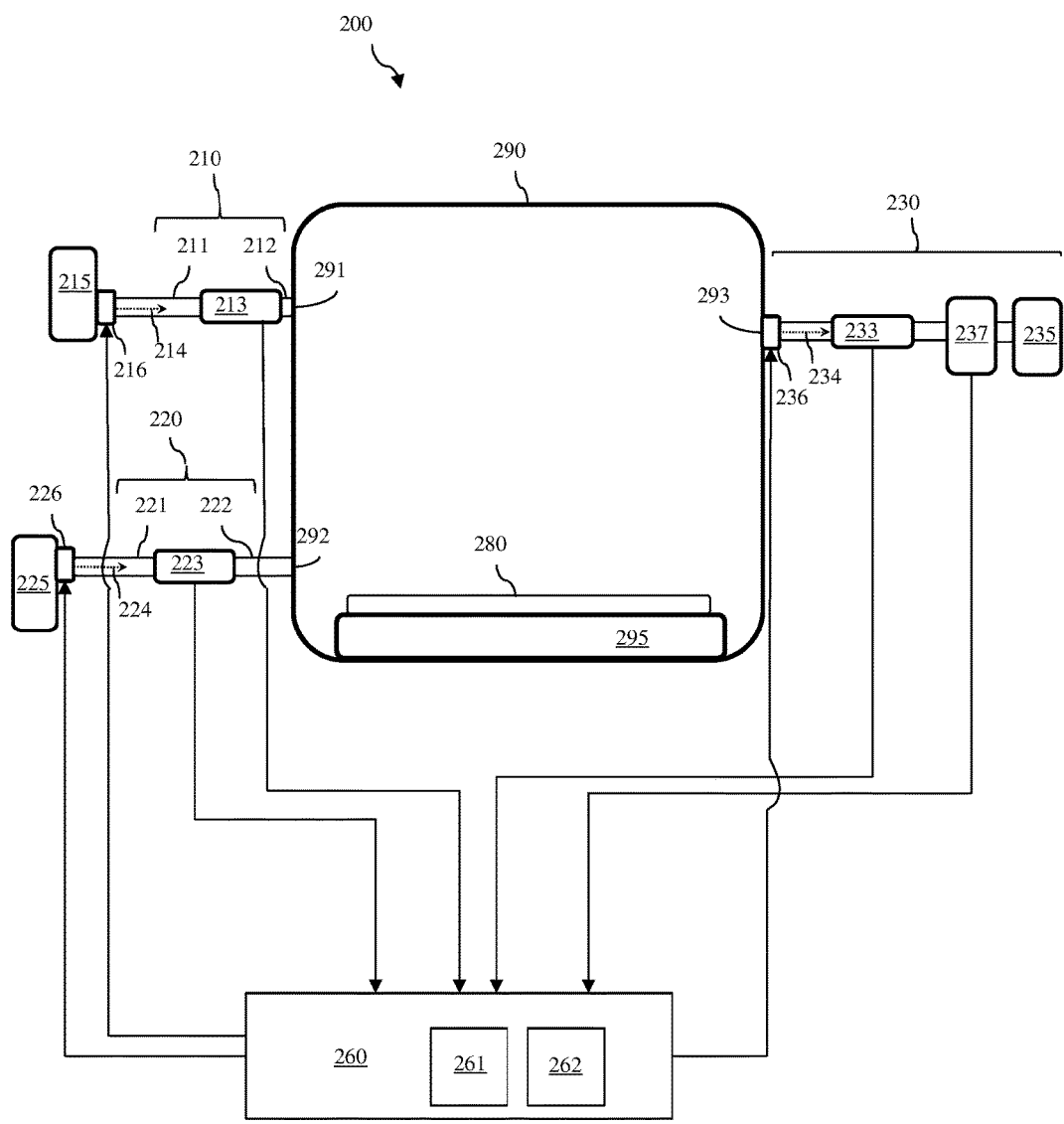
FIG. 2 is a schematic diagram illustrating an embodiment of a process control system that incorporates crystal microbalances into gas flow lines entering and exiting a processing chamber.

Referring to FIG. 2, one exemplary process control system 200 can be specifically for atomic layer deposition (ALD) or atomic layer etching (ALE). This system 200 can include a processing chamber 290 for processing a semiconductor wafer. The processing chamber 290 can be an ALD chamber for depositing an atomic layer of material onto the semiconductor wafer. Alternatively, the processing chamber 290 can be an ALE chamber for etching an atomic layer of material from the wafer. In any case, the processing chamber 290 can include a housing and, within the housing, a chuck 295 for supporting a semiconductor wafer 280 and allowing the semiconductor wafer 280 to be exposed to select gases during the ALD or ALE process. The processing chamber 290 can further have multiple inlets (e.g., at least a first inlet 291 and a second inlet 292) through which the select gases can enter the processing chamber 290 and at least one outlet 293 through which gas can exit the processing chamber 290 (i.e., can be purged from the processing chamber 290).

The system 200 can further include a first gas source 215 for a first gas 214 (e.g., for an active gas); a first tube 210 (i.e., a first gas flow line) connecting the first gas source 215 to the first inlet 291; and a first CM 213 integrated into the first tube 210. For example, the first tube 210 can have a first portion 211 that connects that first gas source 215 to the first CM 213 and a second portion 212 that connects the first CM 213 to the first inlet 291. A first valve 216 can control flow of the first gas 214 from the first gas source 215 into the first tube 210.

The system 200 can further include a second gas source 225 for a second gas 224 (e.g., a carrier gas); a second tube 220 (i.e., a second gas flow line) connecting the second gas source 225 to the second inlet 292; and a second CM 223 integrated into the second tube 220. For example, the second tube 220 can have a first portion 221 that connects that second gas source 225 to the second CM 223 and a second portion 222 that connects the second CM 223 to the second inlet 292. A second valve 226 can control flow of the second gas 224 from the second gas source 225 into the second tube 220.

The system 200 can further include a purge valve 236 at the outlet 293 and a third tube 230 (i.e., a third gas flow line) extending from the outlet 293 (e.g., to a vent or gas collection system 235). The purge valve 236 can control the flow of purged gas 234 from the processing chamber 290 into the third tube 230 (i.e., can control purging of gas from the processing chamber 290). Optionally, the system 200 can further include a third CM 233 and/or a residual gas analyzer 237 integrated into or otherwise connected to the third tube 230 such that purged gas 236 from the processing chamber 290 passes through the third CM 233 and/or passes into the residual gas analyzer 237.

The system 200 can further include a controller 260. The controller 260 can be operably connected to the first valve 216 (which controls the flow of the first gas 214 from the first gas source 215 into the first tube 210), the second valve 226 (which controls the flow of the second gas 224 from the second gas source 225 into the second tube 220), and the purge valve 236 (which controls the flow of purged gas 234 from the processing chamber 290 into the third tube 230). The controller 260 can also be in communication with the first CM 213, the second CM 223 and, if present, the third CM 233 and the residual gas analyzer 237.

As mentioned above, a CM refers to an instrument configured with a crystal sensor (e.g., a quartz crystal sensor) for measuring mass variation. Each of the CMs 213, 223 and 233 in the system 200 of FIG. 2 can be quartz crystal microbalances (QCMs) or some other suitable crystal-type microbalances, which are each configured with a crystal sensor (e.g., a quartz crystal sensor) for measuring mass variation and, in this case, the mass flow rate of a gas flowing through a tube. An exemplary CM that can be incorporated into the system 200 of FIG. 2 (e.g., as the first CM 213, the second CM 223 and the third CM 233) is described in greater detail below and illustrated in FIG. 3.

During processing (i.e., during ALD or ALE), the controller 260 can cause alternating pulsing of the first gas 214 and second gas 224 (also referred to as precursors) into the processing chamber 290 and purging of those gases from the processing chamber 290 between each of the pulses. By repeatedly exposing the surface of the semiconductor wafer 280 to the two gases during separate vapor pulses followed by purges, discrete self-limiting reactions are allowed to occur, thereby resulting in the deposition (or, if applicable, the etching) of an atomic layer of material.

More specifically, during a first pulse, the controller 260 can cause the first valve 216 to be opened for a predetermined period of time, thereby allowing the first gas 214 to flow from the first gas source 215 through the first tube 210 and into the processing chamber 290 at the first inlet 291 such that the surface of the semiconductor wafer 280 is exposed to the first gas 214. It should be noted that, if the first valve 216 has a variable first aperture, the controller 260 can also control the size of the first aperture. Additionally, it should be understood that the time period associated with the first pulse and, if applicable, the size of the first aperture can be predetermined so that the first gas, to which the surface of the semiconductor wafer is exposed, has a given composition and concentration of material(s) (i.e., element(s) or compound(s)) in order to achieve desired results during processing. Immediately following the first pulse, the controller 260 can cause the purge valve 236 to open, thereby purging all residual gas (i.e., purged gas 234) from the processing chamber 290 out the outlet 293 and through the third tube 230 to the vent or gas collection system 235.

During a second pulse that follows the first pulse, the controller 260 can cause the second valve 226 to be opened for a predetermined period of time, thereby allowing the second gas 224 to flow from the second gas source 225 through the second tube 220 and into the processing chamber 290 at the second inlet 292. It should be noted that, if the second valve 226 has a variable second aperture, the controller 260 can also control the size of the second aperture. Additionally, it should be understood that the time period associated with the second pulse and, if applicable, the size of the second aperture can be predetermined so that the second gas, to which the surface of the semiconductor wafer is exposed, has a specific composition and concentration of material(s) (i.e., element(s) or compound(s)) in order to achieve desired results during processing. Immediately following the second pulse, the controller 260 can cause the purge valve 236 to open, thereby purging all gas (i.e., purged gas 234) from the processing chamber 290 out the outlet 293 and through the third tube 230 to the vent or gas collection system 235. The controller 260 can cause the above described pulsing and purging steps to be repeated until deposition (or, if applicable, the etching) of an atomic layer of material occurs.

It should be understood the desired result will vary depending upon whether the process being performed is an ALD process or an ALE process. For an ALD process, the desired result may be an atomic layer of a given composition and thickness. For an ALE process, the desired result may be an etched feature of a given depth. Furthermore, as mentioned above, the results of the ALD and ALE processing may be sensitive to the composition and/or concentration of the gases used in the first and second pulses. Thus, in the system 200 disclosed herein, CMs 213, 223 and, if applicable, 233 incorporated into the gas flow lines allow for real-time monitoring and in-line corrections.

For example, as the first gas 214 flows through the first tube 210, it passes through the first CM 213 and the first CM 213 can determine (i.e., can be adapted to determine, can be configured to determine, etc.) a first actual mass flow rate of the first gas flowing therethrough (i.e., prior to the first gas 214 entering the processing chamber 290). The "first actual mass flow rate" refers to the current mass flow rate as determined by the first CM 213 for the first gas 214 as that first gas 214 flows through the first CM 213 during the first pulse. This first actual mass flow rate may indicate that the composition and concentration of material(s) in the first gas 214 will be on target within the processing chamber 290. Alternatively, the first actual mass flow rate may indicate that the composition and/or concentration of the material(s) in that first gas 214 will be off target within the processing chamber 290 and, thereby that the desired result will not be achieved within the processing chamber 290 and, possibly, that a system failure (e.g., contamination of the first gas or leak of the first gas) has occurred. Similarly, as the second gas 224 flows through the second tube 220, it passes through the second CM 223 and the second CM 223 can determine (i.e., can be adapted to determine, can be configured to determine, etc.) a second actual mass flow rate of the second gas flowing therethrough (i.e., prior to the second gas 224 entering the processing chamber 290). The "second actual mass flow rate" refers to the current mass flow rate as determined by the second CM 223 for the second gas 224 as that second gas 224 flows through the second CM 223 during the second pulse. The second actual mass flow rate may indicate that the composition and concentration of the material(s) in that second gas 224 will be on target within the processing chamber 290. Alternatively, the second mass flow rate may indicate that the composition and/or concentration of the material(s) in that second gas 224 will be off target within the processing chamber 290 and, thereby that the desired result will not be achieved within the processing chamber 290 and, possibly, that a system failure (e.g., contamination of the second gas or leak of the second gas) has occurred.

A finding that composition and/or concentration of the material(s) in the first gas 214 and/or in the second gas 224 will be off target within the processing chamber 290 can trigger corrective action within the system 200.

Specifically, the controller 260 can include a memory 261 that stores, for the process at issue, a previously determined first target mass flow rate for the first gas 214 and a previously determined second target mass flow rate for the second gas 224. The controller 260 can further include a processor 262 that can access the memory 261 and can perform advanced process control (APC), as follows.

During the first pulse, the processor 262 can compare the first actual mass flow rate of the first gas 214, as determined by the first CM 213, to the first target mass flow rate. If the first actual mass flow rate of the first gas 214 is equal to the first target mass flow rate, then the controller 260 can maintain the settings for the first valve 216. However, if the first actual mass flow rate of the first gas 214 is different from the first target mass flow rate, the controller 260 can adjust the settings on the first valve 216, as necessary, in order to meet the first target mass flow rate and, thereby to achieve the desired result in the processing chamber. Adjusting of the settings for the first valve 216 can include, for example, adjusting the first pulse period and/or the aperture size of the first valve 216, if the aperture is variable. Specifically, when the first actual mass flow rate of the first gas 214 is below the first target mass flow rate, the first pulse period and/or the size of the aperture of the first valve 216 can be increased; whereas when the first actual mass flow rate of the first gas 214 is above the first target mass flow rate, the first pulse period and/or the size of the aperture of the first valve 216 can be decreased. Furthermore, if the first actual mass flow rate of the first gas 214 is different from the first target mass flow rate, the controller 260 can also determine the difference between the first actual mass flow rate and the first target mass flow rate and can compare that difference to a first threshold difference stored in the memory 261. When the determined difference exceeds the first threshold difference, a system failure may be indicated. This system failure may be that the first gas is contaminated (e.g., when the first actual mass flow rate is higher than the first target mass flow rate by the first threshold difference) or that there is a leak of the first gas (e.g., when the first actual mass flow rate is lower than the first target mass flow rate by the first threshold difference). When such a system failure is indicated, the controller 260 can cause the first valve 216 to close, thereby stopping all processing.

Similarly, during the second pulse, the processor 262 can compare the second actual mass flow rate of the second gas 224, as determined by the second CM 223, to the second target mass flow rate. If the second actual mass flow rate of the second gas 224 is equal to the second target mass flow rate, then the controller 260 can maintain the settings for the second valve 226. However, if the second actual mass flow rate of the second gas 224 is different from the second target mass flow rate, the controller 260 can adjust the settings on the second valve 226, as necessary, in order to meet the second target mass flow rate and, thereby to achieve the desired result in the processing chamber. Adjusting of the settings for the second valve 226 can include, for example, adjusting the second pulse period and/or the aperture size of the second valve 226, if the aperture is variable. Specifically, when the second actual mass flow rate of the second gas 224 is below the second target mass flow rate, the second pulse period and/or the size of the aperture of the second valve 226 can be increased; whereas when the second actual mass flow rate of the second gas 224 is above the second target mass flow rate, the second pulse period and/or the size of the aperture of the second valve 226 can be decreased. Furthermore, if the second actual mass flow rate of the second gas 224 is different from the second target mass flow rate, the controller 260 can also determine the difference between the second actual mass flow rate and the second target mass flow rate and can compare that difference to a second threshold difference stored in the memory 261. When the determined difference exceeds the second threshold difference, a system failure may be indicated. This system failure may be that the second gas is contaminated (e.g., when the second actual mass flow rate is higher than the second target mass flow rate by the second threshold difference) or that there is a leak of the second gas somewhere in the system (e.g., when the second actual mass flow rate is lower than the second target mass flow rate by the second threshold difference). When such a system failure is indicated, the controller 260 can cause the second valve 216 to close, thereby stopping all processing.

Optionally, the memory 261 can also store, for the process at issue, previously determined pulse-specific target mass flow rates for the purged gas 234 following the first and second pulses. It should be understood that these pulse-specific target mass flow rates for the purged gas 234 after each pulse will vary due to the different chemical reactions taking place within the processing chamber 290 during each pulse. During the purging, the processor 262 can compare a third actual mass flow rate of the purged gas 234, as determined by the third CM 233, to the appropriate pulse-specific target mass flow rate for the purged gas 234 and can take corrective action, if necessary. The "third actual mass flow rate" refers to the current mass flow rate as determined by the third CM 233 for purged gas that gas flows through the third CM 233 at a given period in time (e.g., during a purge period between pulses). For example, if the third actual mass flow rate of the purged gas 234 following each pulse is equal to the appropriate target mass flow rate, then the controller 260 can maintain the settings for the first valve 216 and the second valve 226. However, if the third actual mass flow rate of the purged gas 234 as determined by the third CM 233 following the first pulse is different from a first pulse-specific target mass flow rate, the controller 260 can adjust the settings on the first valve 216. Similarly, if the third actual mass flow rate of the purged gas 234 as determined by the third CM 233 following the second pulse is different from a second pulse-specific target mass flow rate, the controller 260 can adjust the settings on the second valve 226. As mentioned above, adjusting of the settings for the valves 216 and 226 can include, for example, adjusting the pulse period and/or the aperture size or causing the valves to close when a system failure (e.g., gas contamination or leak) is indicated.

Optionally, the memory 261 can also store, for the process at issue, previously determined pulse-specific target residual gas profiles for the purged gas 234 following the first and second pulses. For purposes of this disclosure, a pulse-specific target residual gas profile refers, for example, to an expected profile of the composition and concentration of purged gas following a specific one of the vapor pulses described above. Such a pulse-specific target residual gas profile can, for example, be determined empirically for a specific process step of a specific process using a specific process chamber. During the purging, the residual gas analyzer 237 can analyze the purged gas 234 and the controller 260 can compare the results of the analysis (e.g., an actual residual gas profile indicating the current state of the purged gas including material(s) and concentration of the material(s))) to the appropriate target residual gas profile and can take corrective action (e.g., adjust or close the first and/or second valves 216, 226), as necessary. Residual gas analyzers are well known in the art and, thus, the details of such analyzers have been omitted from this specification in order to allow the reader to focus on the salient aspects of the disclosed system.

Figure 3:
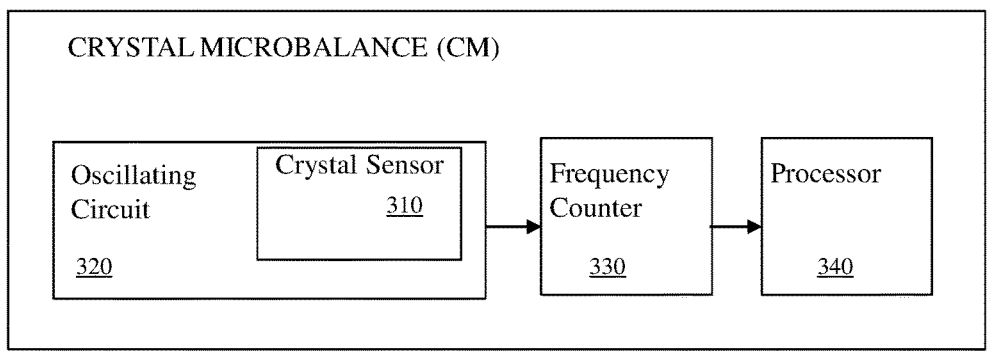
FIG. 3 is a schematic diagram illustrating an exemplary crystal microbalance that can be incorporated into the systems of FIGS. 1 and 2.
Figure 4:
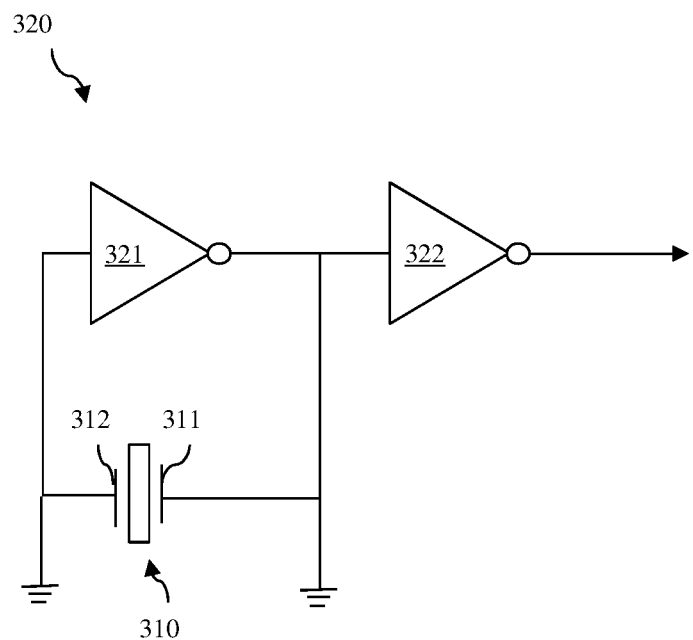
FIG. 4 is a schematic diagram illustrating an exemplary oscillating circuit that can be incorporated into the crystal microbalance of FIG. 3.
Figure 5A:
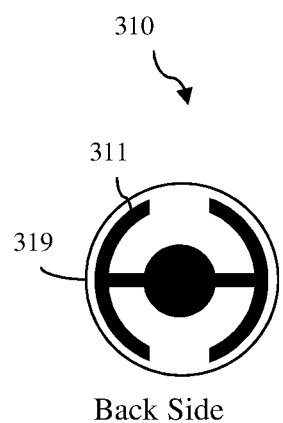
FIGS. 5A-5B are illustrations of the front side and back side, respectively, of an exemplary crystal sensor that can be incorporated into crystal microbalance of FIG. 3.
Figure 5B:
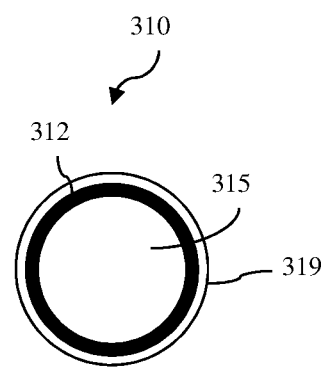

An exemplary CM, which can be incorporated into the system 100 of FIG. 1 as the CM 113 or which can be incorporated into the system 200 of FIG. 2 as the first CM 213, the second CM 223 and the third CM 233, is described in greater detail below and illustrated in FIG. 3. This CM can include, for example, an oscillating circuit 320 with an integrated crystal sensor 310, a frequency counter 330 and a processor 340. FIG. 4 is a schematic diagram illustrating an exemplary oscillating circuit 320 that can be incorporated into the CM of FIG. 3 and FIGS. 5A-5B illustrate the back side and front side, respectively of an exemplary crystal sensor 310 that can be incorporated into the oscillating circuit 320 of FIG. 4. Referring to FIGS. 3, 4 and 5A-5B in combination, the crystal sensor 310 can be a quartz crystal sensor in the case of a QCM or some other suitable crystal-type sensor with an inert crystal material that is selected for optimal resonance properties. In any case, the crystal sensor 310 can include a flat, essentially circular, crystal 319 having a back side and a front side opposite the back side. The back side of the crystal 319 can include a back side electrode 311 and the front side of the crystal 319 can include a front side electrode 312. The front side electrode 312 can, for example, be positioned around the outer edge of the crystal 319, encircling a sensing surface 315 that will be exposed to flowing gas passing through the CM. The oscillating circuit 320 can further include a pair of series connected inverters (i.e., a first inverter 321 and a second inverter 322) with the input to the first inverter 321 being connected to the front side electrode 312 of the crystal sensor 310 and the output the first inverter 321 being connected to both the back side electrode 311 of the crystal sensor 310 and the input of the second inverter 322. The frequency counter 330 can monitor frequency shifts at the output of the second inverter 322 as a result of changes in the resonance of the crystal 319 in response to the changes in the mass of gas passing over the sensing surface 315 at known pressure and temperature. Based on the frequency shifts, a processor 340 in communication with the frequency counter 330 can determine the mass flow rate of the gas. As mentioned above, "mass flow rate" refers to the mass of the gas that flows through a given point (in this case the QCM) per unit time at known pressure and temperature. Those skilled in the art will recognize that the mass flow rate is distinguishable from the volumetric flow rate, which refers to the volume of gas that flows through a given point per unit time.

Figure 6:
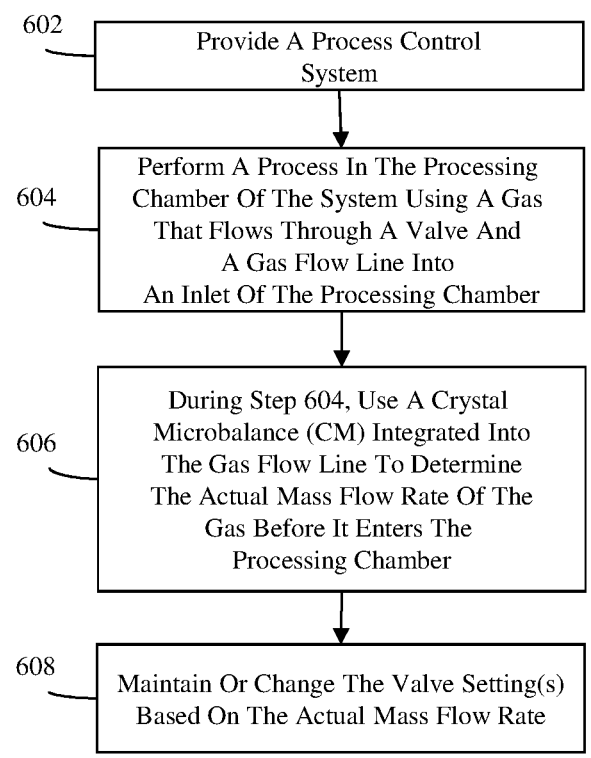
FIG. 6 is a flow diagram illustrating an embodiment of a process control method.

Referring to the flow diagram of FIG. 6, also disclosed herein are embodiments of a process control method. The method can include providing a process control system, such as the system 100 described in detail above and illustrated in FIG. 1 (602).

The method can further include performing, by a processing chamber 190, a process using a gas (604). The process can be, for example, a chemical vapor deposition process for depositing material onto a work piece, a chemical vapor etching process for etching material off of a work piece, a process for cleaning a work piece, or any other suitable process that uses a gas.

The performance of this process at step 604 can specifically include causing a gas 114 to flow from a gas source 115 through a valve 116 and a tube 110 (i.e., a gas flow line) into an inlet 191 of the processing chamber 190.

The method can further include, during step 604, determining an actual mass flow rate of the gas 114 prior to the gas entering the processing chamber 190 using a crystal microbalance (CM) 113 (e.g., a quartz crystal microbalance (QCM) or other suitable crystal-type microbalance), which is integrated into the tube 110 (606). The actual mass flow rate may indicate that the composition and concentration of the material(s) in the gas 114 will be on target within the processing chamber 190 for the process at issue. Alternatively, the actual mass flow rate may indicate that the composition and/or concentration of the material(s) in the gas 114 will be off target within the processing chamber 190 and, thereby that the desired result will not be achieved within the processing chamber and, possibly, that a system failure (e.g., gas contamination or gas leak) has occurred.

Thus, in the method, the settings on the valve 116 used to control the flow of the gas 114 from the gas source 115 into the tube 110 can be either maintained or changed by the controller 160 based on the actual mass flow rate of the gas 114, as determined by the CM 113 (608). Specifically, the method can further include comparing, by a controller 160 of the system 100, the actual mass flow rate of the gas 114, as determined by the CM 113, to a target mass flow rate stored in a memory 161. If the actual mass flow rate of the gas 114 is equal to the target mass flow rate, then the settings for the valve 116 can be maintained by the controller 160. However, if the actual mass flow rate of the gas 114 is different from the target mass flow rate, the settings on the valve 116 can be adjusted, as necessary, in order to meet the target mass flow rate and, thereby to achieve the desired result in the processing chamber. Adjusting of the valve settings at step 608 can include, for example, adjusting the pulse period during which gas 114 is released through the valve 116 and/or the aperture size of the valve 116, if the aperture is variable. Specifically, when the actual mass flow rate of the gas 114 is below the target mass flow rate, the pulse period for opening the valve 116 and/or the size of the aperture of the valve 116 can be increased; whereas when the actual mass flow rate of the gas 114 is above the target mass flow rate, the pulse period for opening the valve 116 and/or the size of the aperture of the valve 116 can be decreased. Furthermore, if the actual mass flow rate of the gas 114 is different from the target mass flow rate, then the difference between the actual mass flow rate and the target mass flow rate can be determined and compared by the controller 160 to a threshold difference that is also stored in the memory 161. When the determined difference exceeds the threshold difference, a system failure may be indicated. This system failure may be a gas contamination (e.g., when the actual mass flow rate is higher than the target mass flow rate by at least the threshold difference) or a gas leak (e.g., when the actual mass flow rate is lower than the target mass flow rate by at least the threshold difference). When such a system failure is indicated, the controller 160 can cause the valve 116 to close, thereby stopping all processing.

Figure 7:
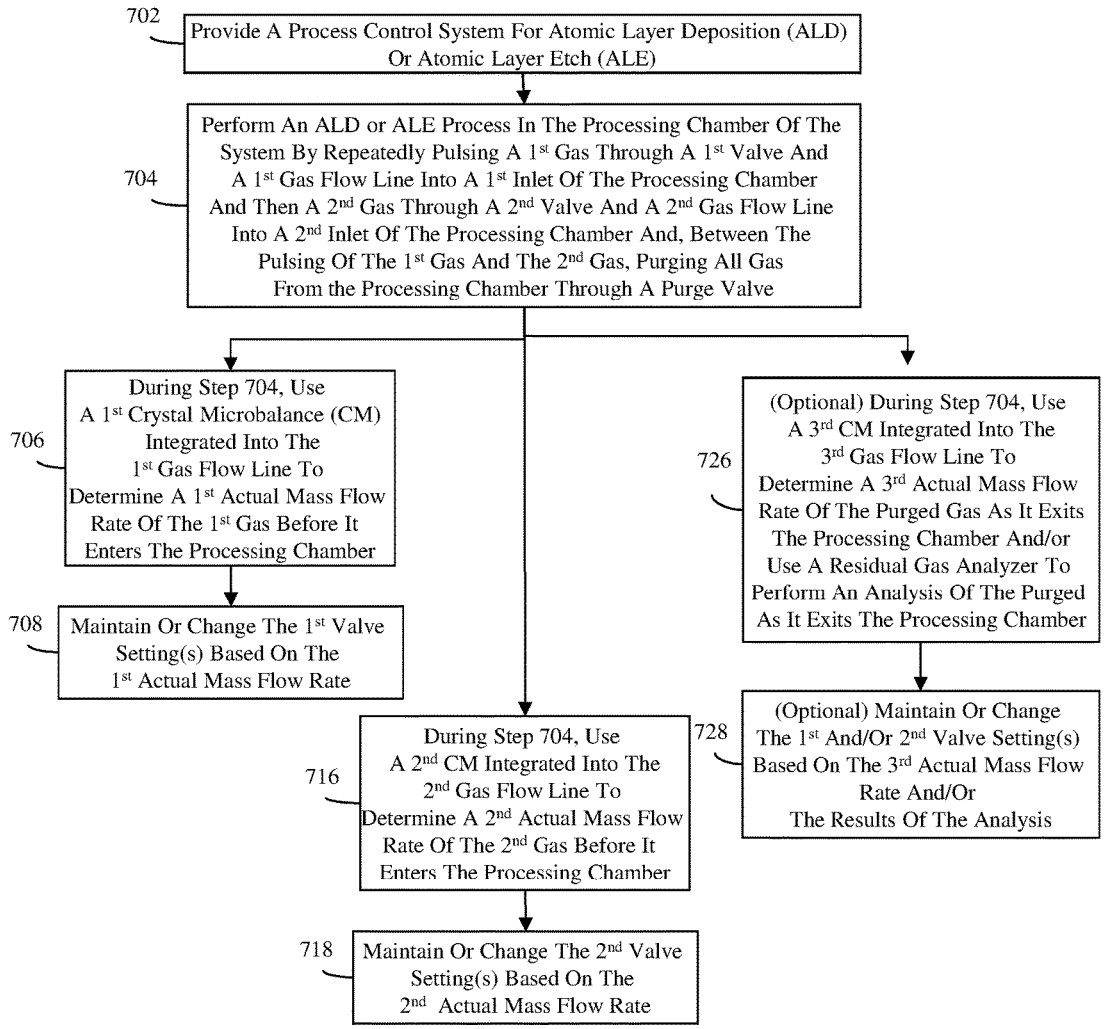
FIG. 7 is a flow diagram illustrating another embodiment of a process control method.

Referring to the flow diagram of FIG. 7, one exemplary process control method can be for atomic layer deposition (ALD) or atomic layer etching (ALE). The method can include providing an ALD or ALE process control system, such as the system 200 described in detail above and illustrated in FIG. 2 (702).

The method can further include performing an ALD process to deposit an atomic layer of material on a semiconductor wafer 280 or an ALE process to etch away an atomic layer of semiconductor material from a semiconductor wafer 280 using the processing chamber 290 of the system 200 (704). Specifically, during step 704, a first gas 214 and a second gas 224 (also referred to as precursors) can be, repeatedly and in sequence, pulsed into the processing chamber 290. Between the pulsing of the first gas 214 and the second gas 224, all gases can be purged from the processing chamber 290. By repeatedly exposing the surface of the semiconductor wafer 280 to the two gases during separate vapor pulses followed by purges, discrete self-limiting reactions are allowed to occur, thereby resulting in the deposition (or, if applicable, the etching) of an atomic layer of material.

More specifically, at step 704, during a first pulse, a first valve 216 opens for a predetermined period of time, thereby allowing a first gas 214 to flow from a first gas source 215 through a first tube 210 (i.e., a first gas flow line) and into the processing chamber 290 at a first inlet 291 such that the surface of the semiconductor wafer 280 is exposed to the first gas 214. During a second pulse that follows the first pulse, a second valve 226 opens for a predetermined period of time, thereby allowing a second gas 224 to flow from a second gas source 225 through a second tube 220 (i.e., a second gas flow line) and into the processing chamber 290 at a second inlet 292. Immediately following each pulse (i.e., following the first pulse and again following the second pulse), the purge valve 236 opens, thereby purging all gas (i.e., purged gas 234) from the processing chamber 290 out an outlet 293 and through a third tube 230 (i.e., a third gas flow line) to a vent or gas collection system 235. The above described pulsing and purging processes are repeated until deposition (or, if applicable, the etching) of an atomic layer of material occurs.

It should be understood the desired result will vary depending upon whether the process being performed is an ALD process or an ALE process. For an ALD process, the desired result may be an atomic layer of a given composition and thickness. For an ALE process, the desired result may be an etched feature of a given depth. Furthermore, as mentioned above, the results of the process may be sensitive to the composition and/or concentration of the gases used in the first and second pulses. Thus, in the method disclosed herein, CMs 213, 223 and, if applicable, 233 (e.g., QCMs or other suitable crystal-type microbalances) can be incorporated into the gas flow lines to allow for real-time monitoring and in-line corrections.

For example, the method can further include, during the first pulse as the first gas 214 flows through the first tube 210, determining a first actual mass flow rate of the first gas 214 flowing therethrough (i.e., prior to the first gas entering the processing chamber 290) using a first CM 213, which is integrated into the first tube 210 (706). This first actual mass flow rate may indicate that the composition and concentration of material(s) in the first gas 214 will be on target within the processing chamber 290. Alternatively, the first mass flow rate may indicate that the composition and/or concentration of the material(s) in that first gas 214 will be off target within the processing chamber 290 and, thereby that the desired result will not be achieved within the processing chamber 290 and, possibly, that a system failure (e.g., contamination of the first gas or leak of the first gas) has occurred.

Thus, in the method, the settings on the first valve 216 used to control the flow of the first gas 214 from the first gas source 215 into the first tube 210 can be either maintained or changed by the controller 260 based on the first actual mass flow rate, as determined by the first CM 213 (708). Specifically, the method can further include comparing, by a controller 260 of the system 200, the first actual mass flow rate of the first gas 214, as determined by the first CM 213, to a first target mass flow rate stored in a memory 261. If the first actual mass flow rate of the first gas 214 is equal to the first target mass flow rate, then the settings for the first valve 216 can be maintained by the controller 260. However, if the first actual mass flow rate of the first gas 214 is different from the first target mass flow rate, the settings on the first valve 216 can be adjusted, as necessary, in order to meet the first target mass flow rate and, thereby to achieve the desired result in the processing chamber. Adjusting of the valve settings at step 708 can include, for example, adjusting the pulse period during which the first gas 214 is released through the first valve 216 and/or the aperture size of the first valve 216, if the aperture is variable. Specifically, when the first actual mass flow rate of the first gas 214 is below the first target mass flow rate, the pulse period for opening the first valve 216 and/or the size of the aperture of the first valve 216 can be increased; whereas when the first actual mass flow rate of the first gas 214 is above the first target mass flow rate, the pulse period for opening the first valve 216 and/or the size of the aperture of the first valve 216 can be decreased.

Furthermore, if the first actual mass flow rate of the first gas 214 is different from the first target mass flow rate, then the difference between the first actual mass flow rate and the first target mass flow rate can be determined and compared by the controller 260 to a threshold difference that is also stored in the memory 261. When the determined difference exceeds the threshold difference, a system failure may be indicated. This system failure may be a gas contamination (e.g., when the first actual mass flow rate is higher than the first target mass flow rate by at least threshold difference) or a gas leak (e.g., when the first actual mass flow rate is lower than the first target mass flow rate by at least the threshold difference). When such a system failure is indicated, the controller 260 can cause the first valve 216 to close, thereby stopping all processing.

Similarly, the method can further include, during the second pulse as the second gas 224 flows through the second tube 220, determining a second actual mass flow rate of the second gas 224 flowing therethrough (i.e., prior to the second gas entering the processing chamber 290) using a second CM 223, which is integrated into the second tube 220 (716). This second actual mass flow rate may indicate that the composition and concentration of material(s) in the second gas 224 within the processing chamber will be on target. Alternatively, the second mass flow rate may indicate that the composition and/or concentration of the material(s) in that second gas 224 within the processing chamber will be off target and, thereby that the desired result will not be achieved within the processing chamber 290 and, possibly, that a system failure (e.g., contamination of the second gas or leak of the second gas) has occurred.

Thus, in the method, the settings on the second valve 226 used to control the flow of the second gas 224 from the second gas source 225 into the second tube 220 can be either maintained or changed by the controller 260 based on the second actual mass flow rate, as determined by the second CM 223 (718). Specifically, the method can further include comparing, by a controller 260 of the system 200, the second actual mass flow rate of the second gas 224, as determined by the second CM 223, to a second target mass flow rate stored in a memory 261. If the second actual mass flow rate of the second gas 224 is equal to the second target mass flow rate, then the settings for the second valve 226 can be maintained by the controller 260. However, if the second actual mass flow rate of the second gas 224 is different from the second target mass flow rate, the settings on the second valve 226 can be adjusted, as necessary, in order to meet the second target mass flow rate and, thereby to achieve the desired result in the processing chamber. Adjusting of the valve settings at step 718 can include, for example, adjusting the pulse period during which the second gas 224 is released through the second valve 216 and/or the aperture size of the second valve 226, if the aperture is variable. Specifically, when the second actual mass flow rate of the second gas 224 is below the second target mass flow rate, the pulse period for opening the second valve 226 and/or the size of the aperture of the second valve 226 can be increased; whereas when the second actual mass flow rate of the second gas 224 is above the second target mass flow rate, the pulse period for opening the second valve 226 and/or the size of the aperture of the second valve 216 can be decreased.

Furthermore, if the second actual mass flow rate of the second gas 224 is different from the second target mass flow rate, the difference between the second actual mass flow rate and the second target mass flow rate can be determined and compared by the controller 260 to a threshold difference that is also stored in the memory 261. When the determined difference exceeds the threshold difference, a system failure may be indicated. This system failure may be a gas contamination (e.g., when the second actual mass flow rate is higher than the second target mass flow rate by at least threshold difference) or a gas leak (e.g., when the second actual mass flow rate is lower than the second target mass flow rate by at least the threshold difference). When such a system failure is indicated, the controller 260 can cause the second valve 226 to close, thereby stopping all processing.

Optionally, the method can further include, during the purging of all gas from the processing chamber 290 between the pulsing of the first and second gases, determining a third actual mass flow rate of the purged gas 234 as it exits from the processing chamber 290 through the third tube 230 using a third CM 233, which is integrated into the third tube 230 (726) Optionally, the method can further include performing an analysis of the purged gas 234 as it exits from the processing chamber through the third tube 230 using a residual gas analyzer 237, which is integrated into the third tube 230. Based on the third actual mass flow rate of the purged gas 234, as determined by the third CM 233, and/or based on the results of the analysis of the purged gas 234 by the residual gas analyzer 237, the settings on the first valve 216 and/or the second valve 226 can be maintained or changed by the controller 260. As mentioned above, adjusting of the settings for the valves 216 and 226 can include, for example, adjusting the pulse period and/or the aperture size or causing the valves to close when a system failure (e.g., gas contamination or leak) is indicated.

As mentioned above, the present invention may be a system or a method. Additionally, aspects of the invention (e.g., the controller, described above) may be implemented in the form a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may have copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
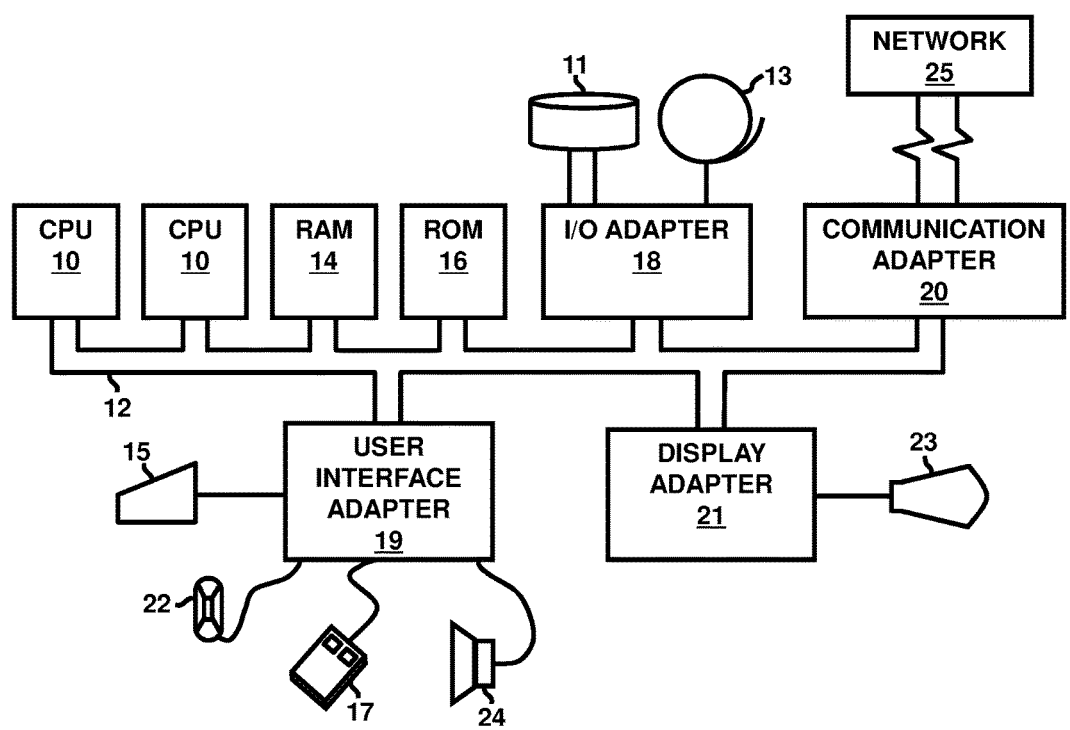
FIG. 8 is a schematic diagram illustrating an exemplary computer system for implementing aspects of the disclosed embodiments.

A representative hardware environment (i.e., a computer system) for implementing aspects of the invention (e.g., the controller) is depicted in FIG. 8. This schematic drawing illustrates a hardware configuration of an information handling/computer system in accordance with the embodiments herein. The system incorporates at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed systems and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are process control systems and methods that incorporate a crystal microbalance (e.g., a quartz crystal microbalance (QCM)) into one or more gas flow lines entering and/or exiting a processing chamber. For example, in the case of an atomic layer deposition (ALD) chamber or an atomic layer etching (ALE) chamber, a CM can be incorporated into each of the gas flow lines entering the chamber as well as into the gas flow line exiting the chamber. Such a CM can measure the resonance of a crystal sensor (e.g., a quartz crystal sensor) contained therein as gas flows over that crystal sensor and can, thereby be used to accurately monitor, in real time, the mass flow rate of the gas. The actual mass flow rate of the gas may indicate that the desired result will not be achieved within the processing chamber and, in response, advanced process control (APC) can be performed (e.g., the controller can adjust the gas flow in order to achieve the desired result). Additionally, the mass flow rate can indicate that gas contamination or other system failure has occurred and, in response, a controller can cause the gas flow to stop. Such CM(s) incorporated into gas flow lines entering and/or exiting a processing chamber can provide precise measurements for process monitoring at minimal cost.

What is claimed is:

1. A system comprising:
    a processing chamber having an inlet;
    a gas source;
    a tube connecting the gas source to the inlet;
    a single valve regulating flow of a gas from the gas source through the tube and into the processing chamber where a surface of a work piece is exposed to the gas;
    a crystal microbalance integrated into the tube outside the processing chamber, wherein the crystal microbalance determines an actual mass flow rate of the gas flowing from the gas source through the tube and into the processing chamber; and
    a controller in communication with the crystal microbalance and operably connected to the valve,
    wherein the controller determines a difference between the actual mass flow rate and a target mass flow rate,
    wherein the target mass flow rate is an optimal mass flow rate for achieving a desired composition and concentration of the gas within the processing chamber in order to further achieve specific results on the surface of the work piece during the processing, and
    wherein the controller adjusts the valve given the difference in order to meet the target mass flow rate.

2. The system of claim 1,
    wherein the tube comprises a first portion connecting the gas source to the crystal microbalance and a second portion connecting the crystal microbalance to the inlet of the processing chamber, and
    wherein the gas flows from the gas source through the first portion, through the crystal microbalance, through the second portion and through the inlet into the processing chamber.

3. The system of claim 1, wherein adjusting of the valve by the controller comprises:
    at least one of increasing a pulse period for opening the valve and increasing a size of an aperture of the valve, when the actual mass flow rate is below the target mass flow rate; and
    at least one of decreasing a pulse period for opening the valve and decreasing a size of an aperture of the valve, when the actual mass flow rate is above the target mass flow rate.

4. The system of claim 1, wherein adjusting of the valve by the controller comprises closing the valve when a difference between the actual mass flow rate and a target mass flow rate is greater than a threshold difference.

5. The system of claim 1, the crystal microbalance comprising a quartz crystal microbalance.

6. The system of claim 1, the crystal microbalance comprising:
    an oscillating circuit with an integrated crystal sensor and a pair of series connected inverters,
        wherein the pair of series connected inverters comprises a first inverter and a second inverter,
        wherein the integrated crystal sensor has a front side and a back side opposite the front side, the front side having a sensing surface and a front side electrode and the back side having a back side electrode, and
        wherein an input of the first inverter is connected to the front side electrode and an output of the first inverter is connected to the back side electrode and to an input of the second inverter;
    a frequency counter connected to an output of the second inverter and monitoring frequency shifts at the output of the second inverter as a result of changes in resonance of the crystal sensor in response to changes in mass of the gas flowing over the sensing surface while passing through the tube; and,
    a processor in communication with the frequency counter and determining the mass flow rate of the gas based on the frequency shifts, wherein the actual mass flow rate is the mass of the gas that flows through the tube passed the crystal microbalance per unit time at a known pressure and temperature.

7. A system comprising:
a processing chamber for processing a surface of a semiconductor wafer, the processing chamber having a first inlet, a second inlet and an outlet;
a first gas source;
a first tube connecting the first gas source to the first inlet;
a single first valve regulating flow of a first gas from the first gas source through the first tube and into the processing chamber where the surface of the semiconductor wafer is exposed to the first gas;
a first crystal microbalance integrated into the first tube outside the processing chamber, wherein the first crystal microbalance determines a first actual mass flow rate of the first gas flowing from the first gas source through the first tube into the processing chamber;
a second gas source;
a second tube connecting the second gas source to the second inlet;
a single second valve regulating flow of a second gas from the second gas source through the second tube and into the processing chamber where the surface of the semiconductor wafer is exposed to the second gas;
a second crystal microbalance integrated into the second tube outside the processing chamber, wherein the second crystal microbalance determines a second actual mass flow rate of the second gas flowing from the second gas source through the second tube into the processing chamber;
a third valve at the outlet;
a controller in communication with the first crystal microbalance and the second crystal microbalance and operably connected to the first valve, the second valve and the third valve,
wherein the controller controls the processing of the surface of the semiconductor wafer in the processing chamber by:
  causing the first valve and the second valve to alternatingly pulse the first gas and the second gas into the processing chamber through the first tube and the second tube, respectively, and further causing the third valve to purge any gas from the processing chamber between pulses such that discrete self-limiting reactions occur at the surface of the semiconductor wafer;
  during a first pulse of the first gas by the first valve, determining a first difference between the first actual mass flow rate and a first target mass flow rate;
  during a second pulse of the second gas by the second valve, determining a second difference between the second actual mass flow rate and a second target mass flow rate; and
  during subsequent pulses of the first gas and the second gas, adjusting at least one of the first valve given the first difference to meet the first target mass flow rate and the second valve given the second difference to meet the second target mass flow rate,
    wherein the first target mass flow rate is a first optimal mass flow rate for achieving a first desired composition and concentration of the first gas within the processing chamber with each first pulse,
    wherein the second target mass flow rate is a second optimal mass flow rate for achieving a second desired composition and concentration of the second gas within the processing chamber with each second pulse, and
    wherein the first desired composition and concentration of the first gas and the second desired composition and concentration of the second gas are predetermined in order to achieve specific results on the surface of the semiconductor wafer during the processing.

8. The system of claim 7,
wherein the first tube comprises a first portion connecting the first gas source to the first crystal microbalance and a second portion connecting the first crystal microbalance to the first inlet of the processing chamber,
wherein the first gas flows from the first gas source through the first portion of the first tube, through the first crystal microbalance, through the second portion of the first tube and into the first inlet of the processing chamber,
wherein the second tube comprises a first portion connecting the second gas source to the second crystal microbalance and a second portion connecting the second crystal microbalance to the second inlet of the processing chamber, and
wherein the second gas flows from the second gas source through the first portion of the second tube, through the second crystal microbalance, through the second portion of the second tube and into the second inlet of the processing chamber.

9. The system of claim 7, the adjusting comprising:
closing the first valve when the first difference between the first actual mass flow rate and the first target mass flow rate is above a first threshold difference; and
closing the second valve when the second difference between the second actual mass flow rate and the second target mass flow rate is above a second threshold difference.

10. The system of claim 7,
the adjusting comprising at least one of increasing a first pulse period for the first pulse and increasing a first size of a first aperture of the first valve when the first actual mass flow rate is below the first target mass flow rate,
the adjusting comprising at least one of decreasing the first pulse period and decreasing the first size of the first aperture when the first actual mass flow rate is above the first target mass flow rate,
the adjusting comprising at least one of increasing a second pulse period for the second pulse and increasing a second size of a second aperture of the second valve when the second actual mass flow rate is below the second target mass flow rate, and
the adjusting comprising at least one of decreasing the second pulse period and decreasing the second size of the second aperture when the second actual mass flow rate is above the second target mass flow rate.

11. The system of claim 7,
the system further comprising a third crystal microbalance and a third tube connecting the outlet to the third crystal microbalance,
the third crystal microbalance determining a third actual mass flow rate of purged gas from the processing chamber, and
the controller further being in communication with the third crystal microbalance and adjusting any of the first valve and the second valve based on the third actual mass flow rate.

12. The system of claim 11, further comprising a residual gas analyzer connected to the third tube and receiving and analyzing the purged gas, the controller further being in communication with the residual gas analyzer and adjusting any of the first valve and the second valve based on results of the analyzing.

13. The system of claim 7, the processing chamber comprising any of an atomic layer deposition chamber and an atomic layer etching chamber.

14. The system of claim 7, the first crystal microbalance and the second crystal microbalance comprising quartz crystal microbalances.

15. A system comprising:
a processing chamber for depositing an atomic layer of material on a surface of a semiconductor wafer, the processing chamber having a first inlet, a second inlet, and an outlet;
a first gas source;
a first tube connecting the first gas source to the first inlet;
a single first valve regulating flow of a first gas from the first gas source through the first tube and into the processing chamber where the surface of the semiconductor wafer is exposed to the first gas;
a first crystal microbalance integrated into the first tube outside the processing chamber, wherein the first crystal microbalance determines a first actual mass flow rate of the first gas flowing from the first gas source through the first tube into the processing chamber;
a second gas source;
a second tube connecting the second gas source to the second inlet;
a single second valve regulating flow of a second gas from the second gas source through the second tube and into the processing chamber where the surface of the semiconductor wafer is exposed to the second gas;
a second crystal microbalance integrated into the second tube outside the processing chamber, wherein the second crystal microbalance determines a second actual mass flow rate of the second gas flowing from the second gas source through the second tube into the processing chamber;
a third valve at the outlet; and
a controller in communication with the first crystal microbalance and the second crystal microbalance and operably connected to the first valve, the second valve, and the third valve,
wherein the controller controls the processing of the surface of the semiconductor wafer in the processing chamber by:
causing the first valve and the second valve to alternatingly pulse the first gas and the second gas into the processing chamber through the first tube and the second tube, respectively, and further causing the third valve to purge any gas from the processing chamber between pulses such that discrete self-limiting reactions occur at the surface of the semiconductor wafer;
during a first pulse of the first gas by the first valve, determining a first difference between the first actual mass flow rate and a first target mass flow rate;
during a second pulse of the second gas by the second valve, determining a second difference between the second actual mass flow rate and a second target mass flow rate; and
during subsequent pulses of the first gas and the second gas, adjusting at least one of the first valve given the first difference to meet the first target mass flow rate and the second valve given the second difference to meet the second target mass flow rate,
wherein the first target mass flow rate is a first optimal mass flow rate for achieving a first desired composition and concentration of the first gas within the processing chamber with each first pulse,
wherein the second target mass flow rate is a second optimal mass flow rate for achieving a second desired composition and concentration of the second gas within the processing chamber with each second pulse, and
wherein the first desired composition and concentration of the first gas and the second desired composition and concentration of the second gas are predetermined in order to achieve deposition, on the surface of the semiconductor wafer during the processing, of the atomic layer such that the atomic layer has a specific composition and thickness.

16. The system of claim 15, the adjusting comprising:
closing the first valve when the first difference between the first actual mass flow rate and the first target mass flow rate is above a first threshold difference; and
closing the second valve when the second difference between the second actual mass flow rate and the second target mass flow rate is above a second threshold difference.

17. The system of claim 15,
the adjusting comprising at least one of increasing a first pulse period for the first pulse and increasing a first size of a first aperture of the first valve when the first actual mass flow rate is below the first target mass flow rate,
the adjusting comprising at least one of decreasing the first pulse period and decreasing the first size of the first aperture when the first actual mass flow rate is above the first target mass flow rate,
the adjusting comprising at least one of increasing a second pulse period for the second pulse and increasing a second size of a second aperture of the second valve when the second actual mass flow rate is below the second target mass flow rate, and
the adjusting comprising at least one of decreasing the second pulse period and decreasing the second size of the second aperture when the second actual mass flow rate is above the second target mass flow rate.

18. The system of claim 15, further comprising:
a third crystal microbalance and a third tube connecting the outlet to the third crystal microbalance,
the third crystal microbalance determining a third actual mass flow rate of purged gas from the processing chamber, and
the controller further being in communication with the third crystal microbalance and adjusting any of the first valve and the second valve based on the third actual mass flow rate.

19. The system of claim 18, further comprising a residual gas analyzer connected to the third tube and receiving and analyzing the purged gas, the controller further being in communication with the residual gas analyzer and adjusting any of the first valve and the second valve based on results of the analyzing.

20. The system of claim 18, the first crystal microbalance, the second crystal microbalance and the third crystal microbalance comprising quartz crystal microbalances.

* * * * *